(12) United States Patent
MacGowan et al.

(10) Patent No.: US 6,753,683 B2
(45) Date of Patent: *Jun. 22, 2004

(54) SYSTEM AND METHOD FOR GENERATING SPECTRA

(75) Inventors: Christopher Keith MacGowan, Toronto (CA); Marshall Stephen Sussman, Toronto (CA); Graham Arnold Wright, Toronto (CA)

(73) Assignee: GE Medical Systems Global Technology Company, LLC, Waukesha, WI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 86 days.

(21) Appl. No.: 10/063,818

(22) Filed: May 15, 2002

(65) Prior Publication Data

US 2003/0214288 A1 Nov. 20, 2003

(51) Int. Cl.[7] .................................................. G01V 3/00
(52) U.S. Cl. ....................................... 324/306; 324/307
(58) Field of Search ............................... 324/306, 307, 324/309, 310, 312, 300

(56) References Cited

U.S. PATENT DOCUMENTS

| 5,309,099 A | * | 5/1994 | Irarrazabal et al. | 324/306 |
| 5,650,723 A | * | 7/1997 | Meyer | 324/309 |
| 5,873,825 A | * | 2/1999 | Mistretta et al. | 600/410 |

OTHER PUBLICATIONS

Bailes, D.R.; Gilderdale, D.J.; Bydder, G.M.; Collins, A.G.; Firmin, D.N.; "Respiratory Ordered Phase Encoding (ROPE): A Method for Reducing Respiratory Motion Artefacts in MR Imaging" Journal of Computer Assisted Tomography 1985; 9(4): 835–838, Jul./Aug.

Einthoven, W.; Fahr, G.; DeWaart, A.; "On the Direction and Manifest Size of the Variations of Potential in the Human Heart and on the Influence of the Position of the Heart on the Form of the Electrocardiogram" American Heart Journal, vol. 40, Aug. 1950, No. 2 p 163–211.

Frayne, Richard; Rutt, Brian K; "Frequency Response of Prospectively Gated Phase–Contrast MR Velocity Measurements" JMRI 1995, 5:65–73.

Hardy, Christopher J.; McKinnon Graeme C.; Saranthan, Manoj; "High–Resolution Coronary Artery Imaging by Adaptive Averaging" Proceeding of the International Society for Magnetic Resonance in Medicine 1999, p 231.

Hardy, Christopher J.; Curwen, Rupert W.; Darrow, Robert, D.; "Robust Coronary MRI by Spiral Fluoroscopy with Adaptive Averaging" ISMRM, 1998 p 22.

Hu, Bob S.; Pauly, John M.; Nishimura, Dwight G.; "Localized Real–Time Velocity Spectra Determination" Magn Reson Med 1993; 30:393–398.

(List continued on next page.)

Primary Examiner—Louis M. Arana
(74) Attorney, Agent, or Firm—Cantor Colburn LLP

(57) ABSTRACT

A system and method for adaptive averaging of velocity spectra using variable density trajectories, comprising: acquiring at least one series of velocity spectra using interleaved variable density trajectories and sampling low $k_y$ data more often or more densely than high $k_y$ data, the series of velocity spectra further comprising at least one spectrum; identifying a series of velocity spectra that comprises at least one velocity spectrum as a template, aligning at least one of the acquired series of velocity spectra with the template using low $k_y$ data; and averaging the aligned spectra, the averaging further comprising averaging the low $k_y$ data of the aligned spectra, and combining the averaged low $k_y$ data with the high $k_y$ data of the aligned spectra, wherein the combination produces enhanced spectra.

15 Claims, 6 Drawing Sheets

OTHER PUBLICATIONS

Luk–Pat, G.T.; Sachs, T.S.; Fayad, Z.A.; Wang, Y.; "3 D Coronary– Artery Imaging with Two–Dimensional Images of the Artery as Navigators" ISMRM 2000; p 1627.

Sabataltis, J.C.; Luk–Pat, G.T; Hu, B.S.; Nishimura, D.G.; "One–Shot Fourier Velocity–Encoding Using a Variable–Density–Trajectory" Proceedings of the ISMRM, 2001 p 372.

Spraggins, Thomas "Wireless Restrospective Gating: Application to Cine Cardiac Imaging" Magnetic Resonance Imaging 1990 p 675–681.

Sussman, M.S.; Wright, G.A.; "Non–ECG–Triggered, High Resolution, Coronary Artery Imaging using Adaptive Averaging with Real–Time Variable–Density Spirals" Proceedings of the ISMRM 2001 p 175.

Sussman, M.S.; Wright, G.A.; "The Correlation Coefficient Technique for Pattern Matching" Proceedings of the ISMRM 1999 p 2003.

Wang, Yi; Ehman, Richard L.; "Retrospective Adaptive Motion Correction for Navigator–Gated 3D Coronary MR Angiography" Journal of Magnetic Resonance Imaging 2000; 11:208–214.

* cited by examiner

SYSTEM AND METHOD FOR GENERATING SPECTRA

BACKGROUND OF THE INVENTION

The field of the invention is nuclear magnetic resonance imaging methods and systems. More particularly, the invention relates to the adaptive averaging of real-time velocity spectra using variable density trajectories.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Cardiovascular diseases that restrict blood flow, such as valvular stenosis and aortic coarcation, can be assessed with measurements of the peak velocity of blood through the constriction. Real-time MR measurements of the velocity spectrum of blood are possible using two dimensional ("2D") selective excitations with one dimensional ("1D") Fourier velocity encoding ("FVE"). However, there is an inherent trade-off between the velocity resolution, aliasing velocity, and temporal resolution of such measurements. To improve the velocity resolution without changing the temporal resolution, variable-density ("VD") trajectories can be used to sample edges of velocity k-space more coarsely than the center. A drawback of a VD approach is that it will introduce aliasing artifacts when the velocity spectrum contains significant high-frequency information (e.g., plug flow). To overcome this problem, an embodiment of the present invention provides for the adaptive averaging of real-time velocity spectra using variable density trajectories.

BRIEF SUMMARY OF THE INVENTION

A system and method for adaptive averaging of velocity spectra using variable density trajectories, comprising: acquiring at least one series of velocity spectra using interleaved variable density trajectories and sampling low $k_v$ data more often or more densely than high $k_v$ data, the series of velocity spectra further comprising at least one spectrum; identifying a series of velocity spectra that comprises at least one velocity spectrum as a template, aligning at least one of the acquired series of velocity spectra with the template using low $k_v$ data; and averaging the aligned spectra, the averaging further comprising averaging the low $k_v$ data of the aligned spectra, and combining the averaged low $k_v$ data with the high $k_v$ data of the aligned spectra, wherein the combination produces enhanced spectra.

DETAILED EMBODIMENT

Figure 1:
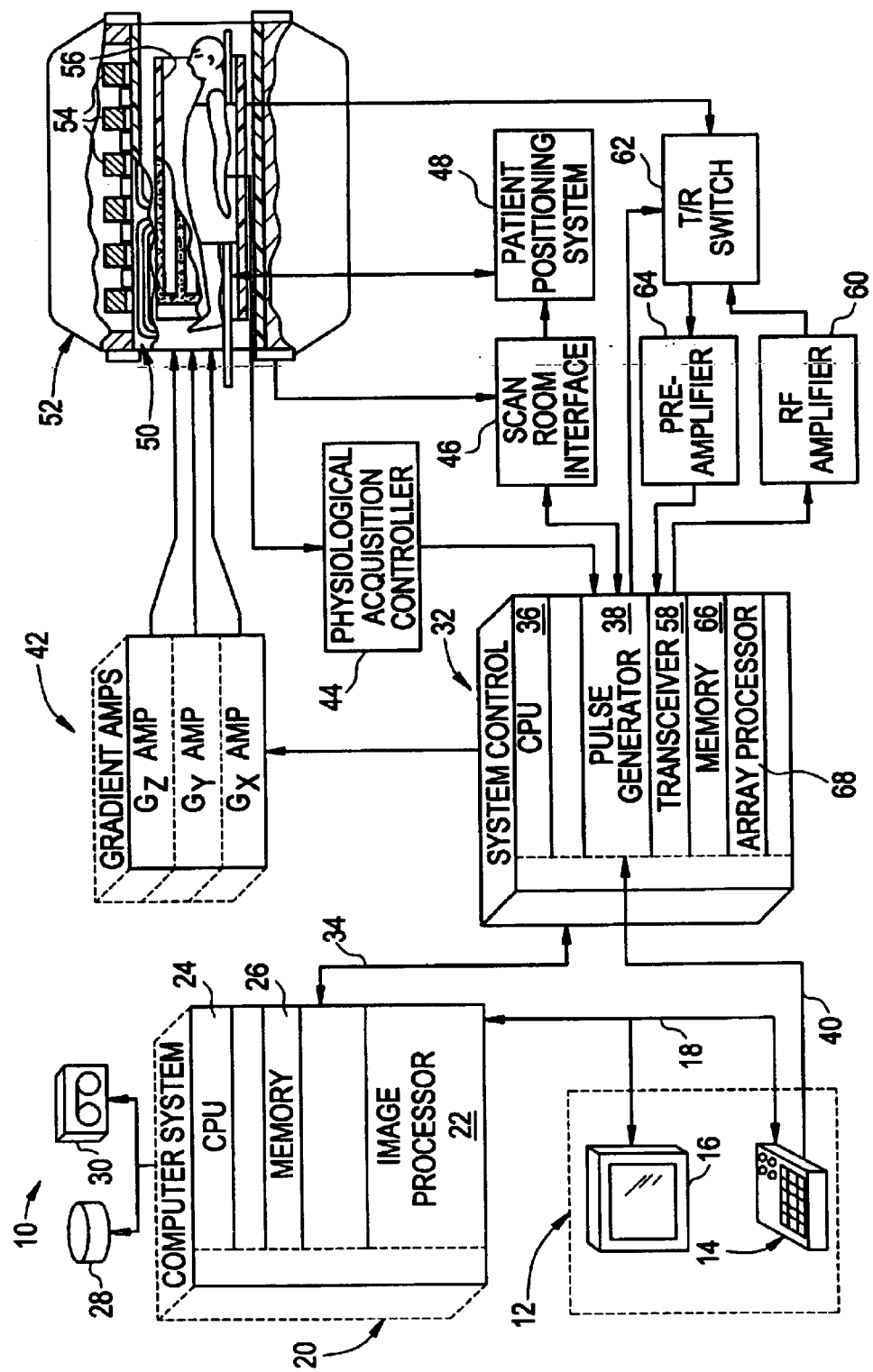
FIG. 1 shows an exemplary MRI system.

Referring first to FIG. 1, there is shown the major components of an exemplary MRI system 10 that incorporates an embodiment of the present invention. It is understood that any MRI or MRI type system may be used without exceeding the scope of the present disclosure. The operation of the system 10 is controlled from an operator console 12 that includes a keyboard and control panel 14 and a display 16. The console 12 communicates through a link 18 with a separate computer system 20 that enables an operator to control the production and display of images on the screen 16. The computer system 20 includes a number of modules that communicate with each other through a backplane. These include an image processor module 22, a CPU module 24 and a memory module 26, known in the art as a frame buffer for storing image data arrays. The computer system 20 is linked to a disk storage 28 and a tape drive 30 for storage of image data and programs, and it communicates with a separate system control 32 through a high speed data link 34.

The system control 32 includes a set of modules connected together by a backplane. These include a CPU module 36 and a pulse generator module 38 which connects to the operator console 12 through a serial link 40. It is through this link 40 that the system control 32 receives commands from the operator which indicate the scan sequence that is to be performed. The pulse generator module 38 operates the system components to carry out the desired scan sequence. It produces data which indicates the timing, strength and shape of the RF pulses which are to be produced, and the timing of and length of the data acquisition window. The pulse generator module 38 connects to a set of gradient amplifiers 42, to indicate the timing and shape of the gradient pulses to be produced during the scan. The pulse generator module 38 also receives patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to a gradient amplifier system 42 comprised of $G_x$, $G_y$, and $G_z$ amplifiers. Each gradient amplifier 42 excites a corresponding gradient coil in an assembly 50 generally designated to produce the magnetic field gradients used for position encoding acquired signals. The gradient coil assembly 50 forms part of a magnet assembly 52 that includes one or more polarizing magnet 54 and an RF coil 56. A transceiver module 58 in the system control 32 produces pulses that are amplified by an RF amplifier 60 and coupled to the RF coil 56 by a transmit/receive switch 62. The resulting signals radiated by the excited nuclei in the patient may be sensed by the same RF coil 56 and coupled through the transmit/receive switch 62 to a preamplifier 64. The amplified NMR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 during the receive mode. The transmit/receive switch 62 also enables a separate RF coil (for example, a surface colt) to be used in either the transmit or receive mode.

The NMR signals picked up by the RF coil 56 are digitized by the transceiver module 58 and transferred to a memory module 66 in the system control 32. When the scan is completed and an array of raw k-space data has been acquired in the memory module 66. This raw k-space data may be rearranged into separate k-space data arrays for each cardiac phase image (or other images) to be reconstructed, and each of these is input to an array processor 68 which operates to Fourier transform the data into an array of image data. This image data is conveyed through the serial link 34 to the computer system 20 where it is stored in the disk memory 28. In response to commands received from the operator console 12, this image data may be archived on the tape drive 30, or it may be further processed by the image processor 22 and conveyed to the operator console 12 and presented on the display 16.

Figure 2:
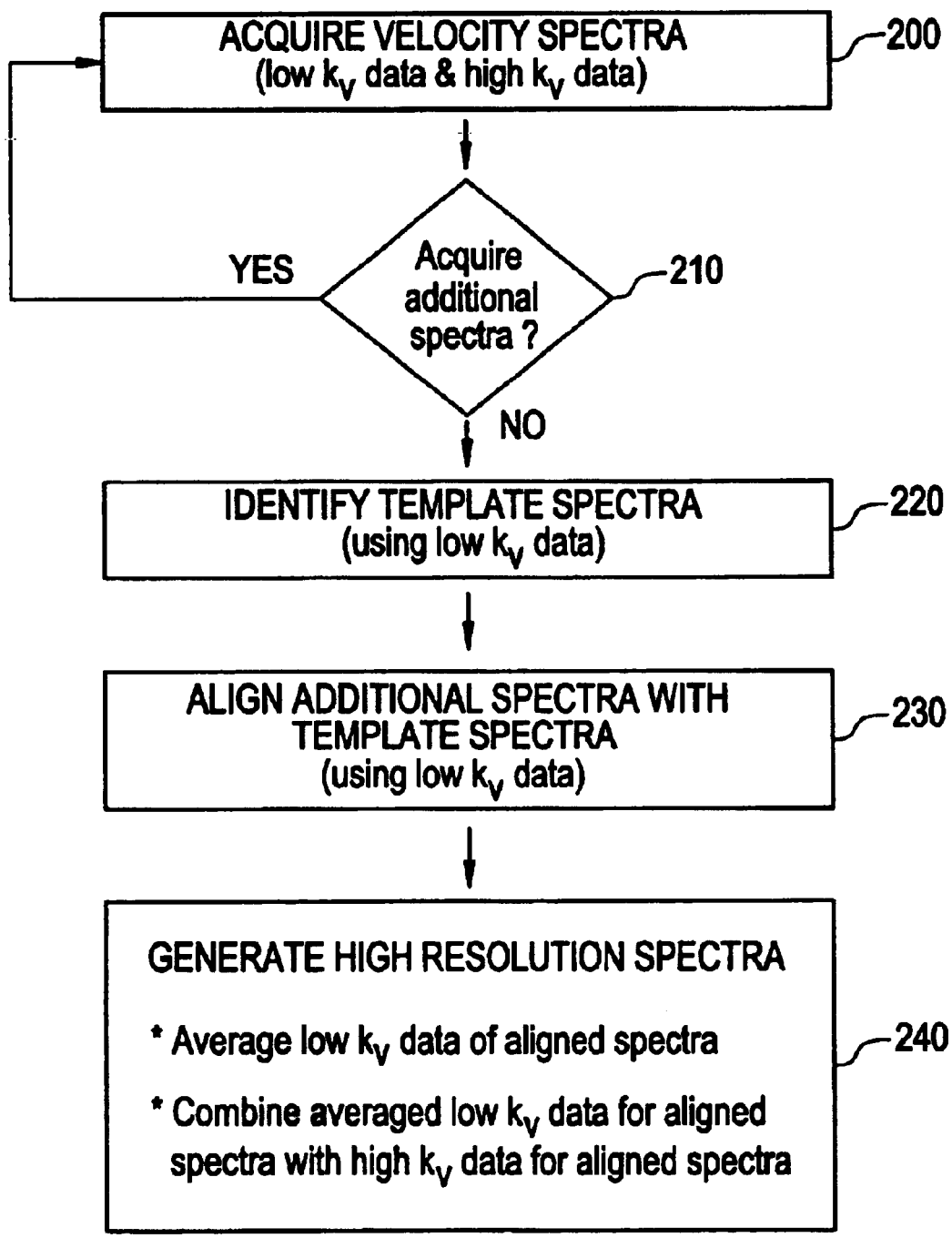
FIG. 2 shows a flow chart of exemplary steps for adaptive averaging of real-time velocity spectra using variable density trajectories.

Referring to FIG. 2, a flow chart of exemplary steps for adaptive averaging of real-time velocity spectra using variable density trajectories is shown. Real-time MR measurements of the velocity spectrum are acquired at 200, 210 to produce an MR signal from the image subject, and an oscillating readout gradient is used to provide spatial and velocity encoding. A VD trajectory is used that samples the edge of velocity k-space less densely. However, where the velocity spectrum contains significant high-frequency information, aliasing artifacts may result. To prevent aliasing artifacts, an embodiment utilizes interleaved VD trajectories designed to sample low $k_v$ data more often or more densely than high $k_v$ data. The center of velocity k-space is obtained each acquisition thereby allowing low velocity-resolution spectra to be reconstructed using only low $k_v$ data, which results in the reduction of aliasing artifacts.

From the zeroth moment ("$k_x$") and first moment ("$k_v$") of the readout gradient, the trajectory through velocity k-space [$k_x(t), k_v(t)$] is constructed. The spatial frequency content of a volume producing an MR signal is represented by $k_x$. A measure of the frequency content of a velocity spectrum is represented by $k_v$. The readout gradient represents the application of a magnetic field gradient applied during the acquisition of an MR signal. The 2D Fourier transform of a portion of the sampled k-space provides the velocity spectrum as a function of vessel position. A plot of the spectrum (at one position) from sequential acquisitions gives the velocity spectrum as a function of time. The aliasing velocity is determined by the spacing of the trajectory along $k_v$, while the velocity resolution is determined by the maximum value of $k_v$ acquired.

At least one series of acquired spectra comprising at least one acquired spectrum is identified as a template or template series ("template") at 220 by evaluating its low $k_v$ data. Additional spectra are selected and aligned with the template at 230 by evaluating its low $k_v$ data using a correlation coefficient ("CC") or similar algorithm to identify similarities among the template and the additional spectra. In one embodiment, alignment is performed by translating one or more of the additional spectra across the template spectra until the similar features of the overlapping spectra are aligned. Enhanced spectra are generated from aligned spectra at 240 by averaging the data from the full k-space trajectories of the aligned spectra. Enhanced spectra includes, but is not limited to, at least one of the following: spectra of greater velocity, temporal, or spatial resolution, or spectra of greater aliasing velocity. For example, one embodiment as shown at 240 provides for the averaging of the low $k_v$ data of the aligned spectra followed by the combining of the averaged low $k_v$ data with the high $k_v$ data of the aligned spectra. Additionally, other MR data acquired as part of the real-time data acquisition may be combined following alignment.

Figure 3:
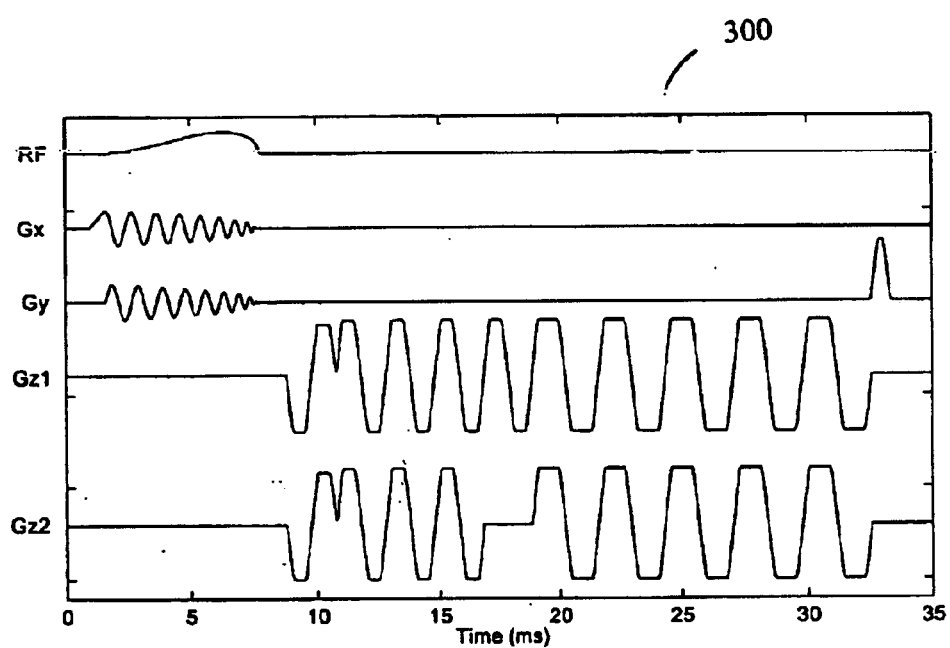
FIG. 3 shows an exemplary sequence diagram.
Figure 4:
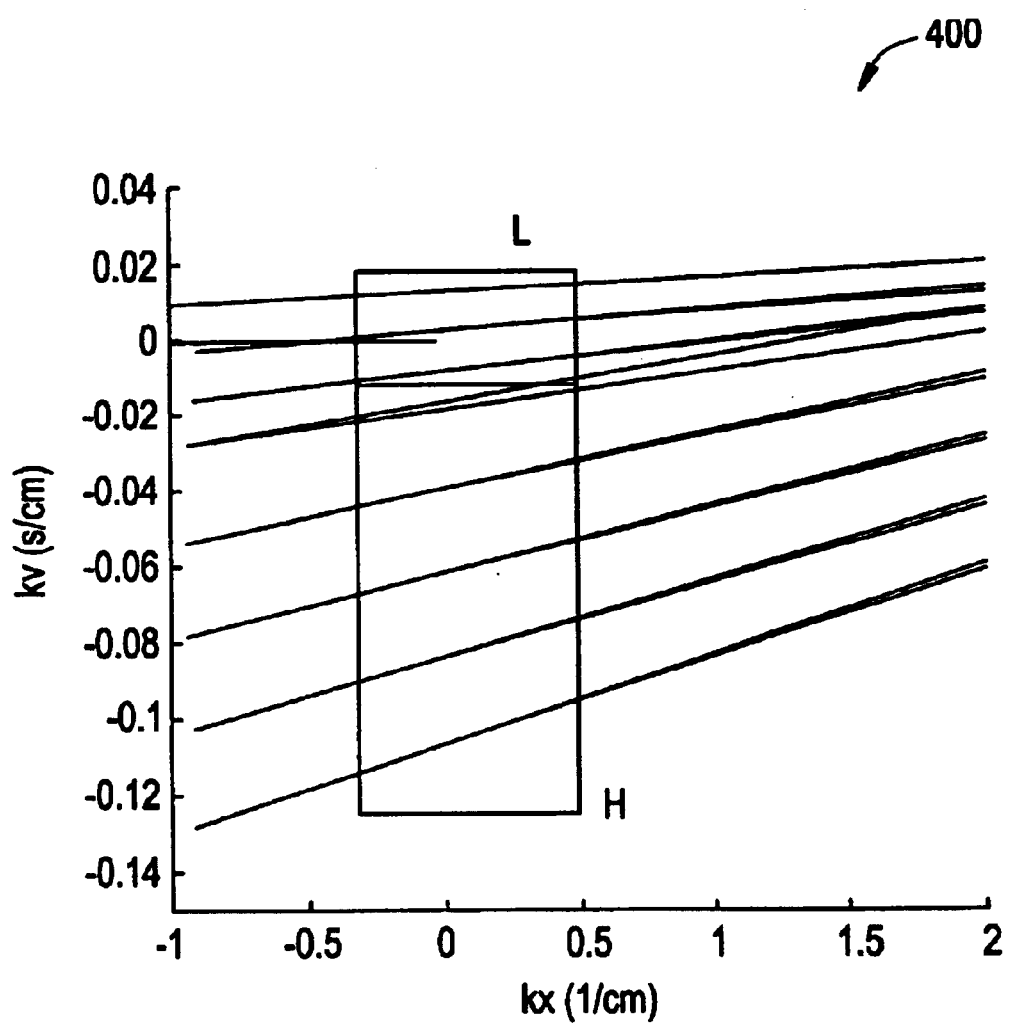
FIG. 4 shows exemplary k-space trajectories.
Figure 5:
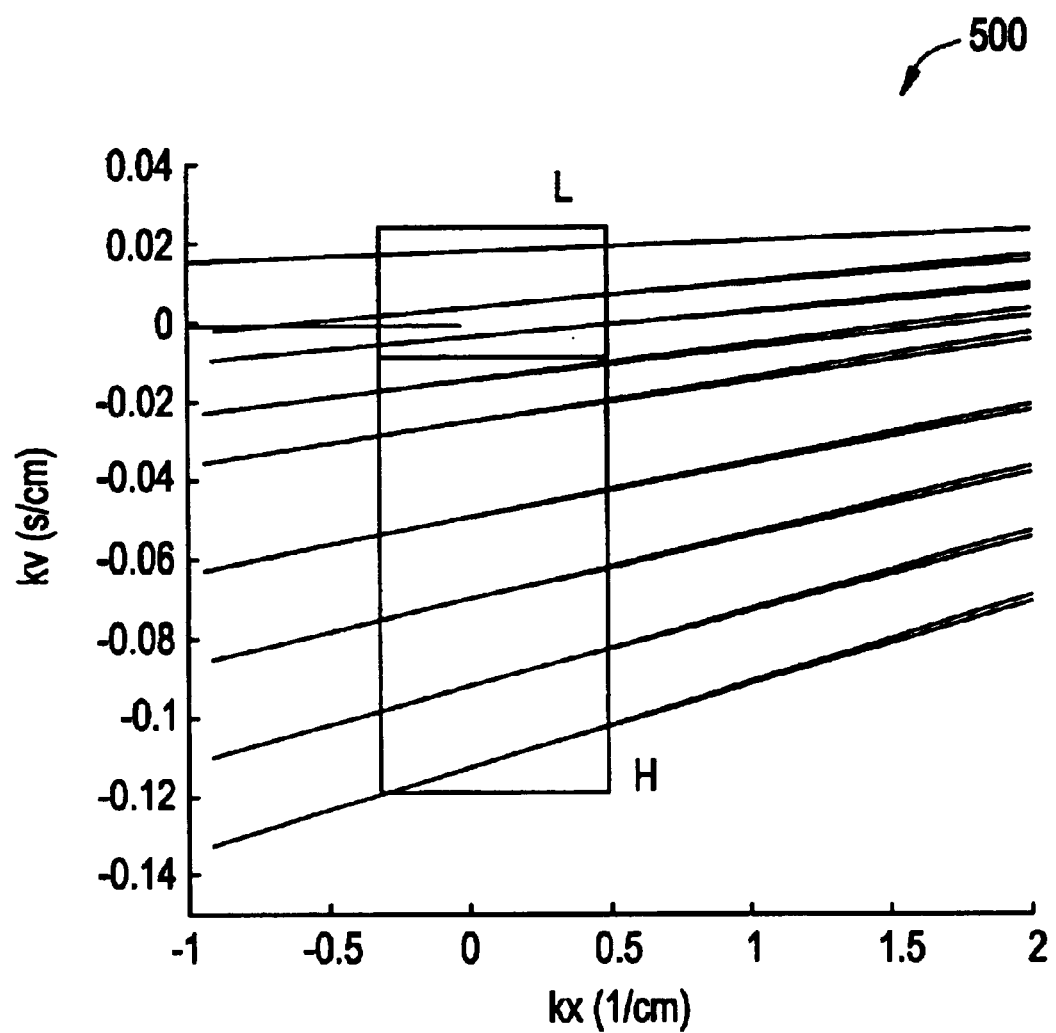
FIG. 5 shows exemplary k-space trajectories.

Referring to FIGS. 3 through 5, a sequence diagram 300 and k-space trajectories 400, 500 for an exemplary embodiment including a General Electric Signa LX 1.5T MR system are shown. A real-time measurement of velocity spectra (single-shot FVE sequence) is shown at 300. The sequence consists of a 2D selective excitation lasting 6.5 ms, followed by an oscillating readout gradient consisting of ten bipolar trapezoidal gradients (max. amplitude=40 mT/m/ ms). For the VD acquisition, the absolute area under the last five bipolar trapezoids was increased in order to reduce sampling density by 50% along $k_v$. Interleaving is achieved by setting one of the bipolar gradient to zero during every second acquisition.

Using this VD sequence, acquisition of velocity spectra is acquired in a pulsatile flow phantom for 30 s, with 40 ms temporal resolution. Low-resolution spectra is reconstructed using the common portions of the two VD trajectories at 400, 500 ($|kv|<0.02$ s·cm$^{-1}$), from which a single representative flow cycle is extracted (shown at 660 of FIG. 6). The remaining velocity spectra are divided into templates 440 ms wide (i.e., 11 spectra), and aligned with the representative flow cycle using a CC algorithm. Once aligned, corresponding data from the entire VD trajectories are combined ($|kv|<0.12$ s·cm$^{-1}$) to produce more uniformly sampled k-space, and hence high-resolution spectra (shown at 620 of FIG. 6).

Figure 6:
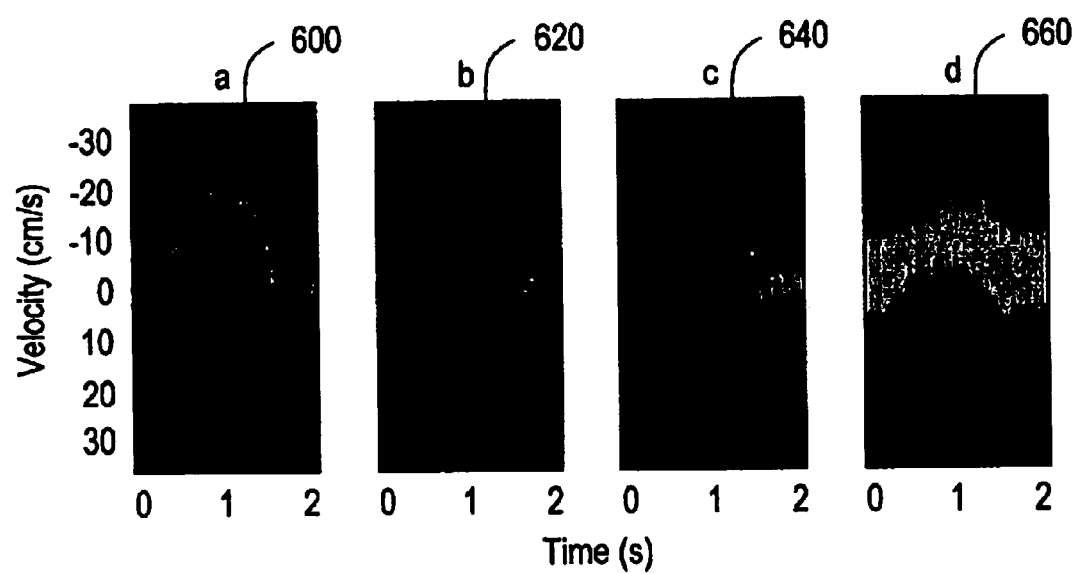
FIG. 6 shows exemplary velocity spectra.

FIG. 6 shows exemplary velocity spectra measured using uniform k-space sampling with equal temporal resolution but twenty percent lower velocity resolution 600, VD sampling with adaptive averaging 620, VD sampling without adaptive averaging 640, and low $k_v$ sampling only (common to both trajectories) 660. A considerable reduction in aliasing artifacts is obtained using VD sampling and adaptive averaging 620, compared with VD and no averaging 640, at equal velocity resolution. There is also increased sharpness of the adaptively averaged spectrum 620 compared to both uniform sampling 600 and un-averaged VD sampling 660.

An advantage of an embodiment of the present invention is the use of real-time, unaliased velocity spectra for combining flow data from different flow cycles. Another advantage is the use of interleaved variable-density trajectories to obtain high-velocity-resolution spectra. Another advantage is the use of a CC algorithm to align real-time velocity measurements to a template. Another advantage is the ability to further increase velocity, spatial or temporal resolution using a larger number of interleaves or different trajectories.

Although the preceding embodiments are discussed with respect to medical imaging, it is understood that the image acquisition and processing methodology described herein is not limited to medical applications, but may be utilized in non-medical applications.

The description applying the above embodiments is merely illustrative. As described above, embodiments in the form of computer-implemented processes and apparatuses for practicing those processes may be included. Also included may be embodiments in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. Also included may be embodiments in the form of computer program code, for example, whether stored in a storage medium, loaded into and/or executed by a computer, or as a data signal transmitted, whether a modulated carrier wave or not, over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed for carrying out this invention, but that the invention will include all embodiments falling within the scope of the appended claims.

What is claimed is:

1. A method for adaptive averaging of velocity spectra using variable density trajectories, comprising:

acquiring at least one series of velocity spectra, said acquisition being performed using interleaved VD trajectories, said interleaved VD trajectories sampling low $k_y$ data more often or more densely than high $k_y$ data, said series of velocity spectra further comprising at least one spectrum;

identifying a series of velocity spectra comprising at least one velocity spectrum as a template, said template being identified using said low $k_y$ data;

aligning at least one of said acquired series of velocity spectra with said template, said alignment being performed using said low $k_y$ data; and averaging said aligned spectra, said averaging further comprising averaging said low $k_y$ data of said aligned spectra, and combining said averaged low $k_y$ data with said high $k_y$ data of said aligned spectra, wherein said combination produces enhanced spectra.

2. A method as in claim 1 wherein said acquiring a series of velocity spectra includes acquiring cycle and/or phase information for said acquired series of velocity spectra, said phase information including an indicator of the phase of a cycle during which said velocity spectra is acquired, said indicator being used for aligning corresponding velocity spectra from at least one cycle.

3. A method as in claim 1 wherein said aligning is performed using a correlation coefficient algorithm.

4. A method as in claim 3 further comprising at least one of the following:

using a 2D Fourier transform of said sampled low $k_y$ and said sampled high $k_y$ to determine a velocity spectrum as a function of vessel position;

using a plot of spectra from sequential acquisitions to determine a velocity spectrum as a function of time;

determining an aliasing velocity as a function of trajectory spacing along $k_y$; and determining a velocity resolution as a function of the maximum value of $k_y$.

5. A method as in claim 3 wherein said enhanced spectra includes at least one of the following:

spectra of high velocity resolution, spectra of high spatial resolution, spectra of high temporal resolution, and spectra of high aliasing velocity.

6. A system for adaptive averaging of velocity spectra using variable density trajectories, comprising:

a MRI system including a plurality of k-space data points; and a computer system in communication with said MRI system, said computer system enabled for executing computer program code to implement the method comprising:

acquiring at least one series of velocity spectra, said acquisition being performed using interleaved VD trajectories, said interleaved VD trajectories sampling low $k_y$ data more often or more densely than high $k_y$ data, said series of velocity spectra further comprising at least one spectrum;

identifying a series of velocity spectra comprising at least one velocity spectrum as a template, said template being identified using said low $k_y$ data;

aligning at least one of said acquired series of velocity spectra with said template, said alignment being performed using said low $k_y$ data; and averaging said aligned spectra, said averaging further comprising averaging said low $k_y$ data of said aligned spectra, and combining said averaged low $k_y$ data with said high $k_y$ data of said aligned spectra, wherein said combination produces enhanced spectra.

7. A system as in claim 6 wherein said acquiring a series of velocity spectra includes acquiring cycle and/or phase information for said acquired series of velocity spectra, said phase information including an indicator of the phase of a cycle during which said velocity spectra is acquired, said indicator being used for aligning corresponding velocity spectra from at least one cycle.

8. A system as in claim 6 wherein said aligning is performed using a correlation coefficient algorithm.

9. A system as in claim 8 further comprising at least one of the following:

using a 2D Fourier transform of said sampled low $k_y$ and said sampled high $k_y$ to determine a velocity spectrum as a function of vessel position;

using a plot of spectra from sequential acquisitions to determine a velocity spectrum as a function of time;

determining an aliasing velocity as a function of trajectory spacing along $k_y$; and determining a velocity resolution as a function of the maximum value of $k_y$.

10. A system as in claim 8 wherein increasing the number of said VD interleaves acquired causes an increase in at least one of the following:

velocity resolution of the generated spectra,
spatial resolution of the generated spectra, and
temporal resolution of the generated spectra.

11. An article of manufacture comprising:
a computer usable medium having computer readable program code for adaptive averaging of velocity spectra using variable density trajectories, said computer readable program code further comprising computer readable program code for performing the following:
acquiring at least one series of velocity spectra, said acquisition being performed using interleaved VD trajectories, said interleaved VD trajectories sampling low $k_y$ data more often or more densely than high $k_y$ data, said series of velocity spectra further comprising at least one spectrum;
identifying a series of velocity spectra comprising at least one velocity spectrum as a template, said template being identified using said low $k_y$ data;
aligning at least one of said acquired series of velocity spectra with said template, said alignment being performed using said low $k_y$ data; and
averaging said aligned spectra, said averaging further comprising averaging said low $k_y$ data of said aligned spectra, and combining said averaged low $k_y$ data with said high $k_y$ data of said aligned spectra, wherein said combination produces enhanced spectra.

12. An article of manufacture as in claim 11 further comprising computer readable program code for acquiring cycle and/or phase information for said acquired series of velocity spectra, said phase information including an indicator of the phase of a cycle during which said velocity spectra is acquired, said indicator being used for aligning corresponding velocity spectra from at least one cycle.

13. An article as in claim 11 further comprising computer readable program code for aligning spectra using a correlation coefficient algorithm.

14. An article of manufacture as in claim 13 wherein said computer readable program code further comprises computer readable program code for performing at least one of the following:
using a 2D Fourier transform of said sampled low $k_y$ and said sampled high $k_y$ to determine a velocity spectrum as a function of vessel position;
using a plot of spectra from sequential acquisitions to determine a velocity spectrum as a function of time;
determining an aliasing velocity as a function of trajectory spacing along $k_y$; and
determining a velocity resolution as a function of the maximum value of $k_y$.

15. A an article of manufacture as in claim 13 wherein increasing the number of said VD interleaves acquired causes an increase in at least one of the following:
velocity resolution of the generated spectra,
spatial resolution of the generated spectra, and
temporal resolution of the generated spectra.

* * * * *